(12) United States Patent
Song et al.

(10) Patent No.: US 9,190,187 B2
(45) Date of Patent: Nov. 17, 2015

(54) PASTE COMPOSITION FOR SOLAR CELL ELECTRODE, ELECTRODE FABRICATED USING THE SAME, AND SOLAR CELL INCLUDING THE SAME

(75) Inventors: Dae Seop Song, Uiwang-si (KR); Young Wook Choi, Uiwang-si (KR); Sang Hyun Yang, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 413 days.

(21) Appl. No.: 13/595,162

(22) Filed: Aug. 27, 2012

(65) Prior Publication Data

US 2013/0134363 A1 May 30, 2013

(30) Foreign Application Priority Data

Nov. 25, 2011 (KR) .................. 10-2011-0124644

(51) Int. Cl.
- H01B 1/16 (2006.01)
- H01B 1/22 (2006.01)
- H01L 21/283 (2006.01)
- H01L 31/0224 (2006.01)

(52) U.S. Cl.
CPC .......... *H01B 1/22* (2013.01); *H01L 31/022425* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 2009/0134767 A1* | 5/2009 | Cho et al. | 313/326 |
| 2009/0283725 A1* | 11/2009 | Lee et al. | 252/501.1 |
| 2010/0112195 A1 | 5/2010 | Kodas et al. | |
| 2012/0097237 A1 | 4/2012 | Lee et al. | |
| 2012/0103410 A1* | 5/2012 | Park et al. | 136/256 |
| 2012/0119153 A1* | 5/2012 | Choi | 252/500 |
| 2012/0161082 A1* | 6/2012 | Kim et al. | 252/512 |
| 2013/0017483 A1* | 1/2013 | Kuroki | 430/270.1 |
| 2013/0140500 A1* | 6/2013 | Jung et al. | 252/513 |
| 2013/0146135 A1* | 6/2013 | Lee et al. | 136/256 |

FOREIGN PATENT DOCUMENTS

| | | |
|---|---|---|
| CN | 1531763 A | 9/2004 |
| CN | 101304050 A | 11/2008 |
| CN | 101441904 A | 5/2009 |
| EP | 0546560 A1 * | 6/1993 |
| EP | 2-058-865 A1 | 5/2009 |
| JP | 2005213531 A * | 8/2005 |
| JP | 2010109334 A | 5/2010 |
| WO | WO 2010/117207 A2 | 10/2010 |

OTHER PUBLICATIONS

German Office Action dated Nov. 26, 2013.
Office Action mailed Jan. 13, 2015 in corresponding Chinese Patent Application No. 2012103071796.

* cited by examiner

*Primary Examiner* — Lorna M Douyon
(74) *Attorney, Agent, or Firm* — Lee & Morse, P.C.

(57) ABSTRACT

A paste composition for solar cell electrodes includes conductive particles, a glass frit, an organic binder and a solvent. The conductive particles include at least two groups of conductive particle having different particle diameter distributions. The conductive particle may have an average particle diameter (D50') of about 1.85 μm or less and a particle diameter (D90') at 90% of the cumulative particle diameter distribution of about 3.10 μm or less.

9 Claims, 1 Drawing Sheet

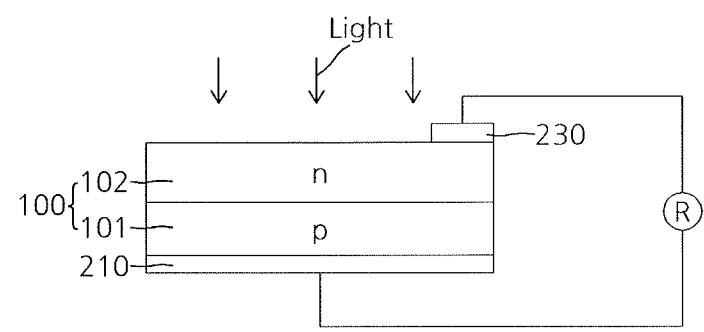

PASTE COMPOSITION FOR SOLAR CELL ELECTRODE, ELECTRODE FABRICATED USING THE SAME, AND SOLAR CELL INCLUDING THE SAME

CROSS-REFERENCE TO RELATED APPLICATION

This application claims priority under 35 U.S.C. §119 to Korean Patent Application No. 10-2011-0124644, filed on Nov. 25, 2011, in the Korean Intellectual Property Office, and entitled: "PASTE COMPOSITION FOR SOLAR CELL ELECTRODE, ELECTRODE FABRICATED USING THE SAME, AND SOLAR CELL INCLUDING THE SAME," the disclosure of which is incorporated by reference herein in its entirety.

BACKGROUND

1. Field

Embodiments relate to a paste composition for solar cell electrodes, an electrode fabricated using the same, and a solar cell including the same.

2. Description of the Related Art

A sintering type paste for solar cell electrodes may be prepared under different optimal sintering conditions, depending on the surface treatment of a silicon substrate, the formation of an anti-reflection layer, and the unevenness of the thickness of an emitter layer.

SUMMARY

Embodiments are directed to a paste composition for solar cell electrodes, the paste composition including conductive particles, a glass frit, an organic binder, and a solvent, wherein the conductive particles include at least two groups of conductive particle having different particle diameter distributions, and the conductive particles have an average particle diameter (D50') according to the following Equation 1 of about 1.85 µm or less and a particle diameter (D90') at 90% of the cumulative particle diameter distribution according to the following Equation 2 of about 3.10 µm or less:

$$\text{average particle diameter } (D50') = \frac{(X1*Y1) + (X2*Y2) + \ldots + (Xn*Yn)}{X1 + X2 + \ldots + Xn} \quad \text{[Equation 1]}$$

$$\text{particle diameter at 90\% of the cumulative particle diameter distribution } (D90') = \frac{(X1*Z1) + (X2*Z2) + \ldots + (Xn*Zn)}{X1 + X2 + \ldots + Xn} \quad \text{[Equation 2]}$$

where,

X1: content of first conductive particle group (wt %);
X2: content of second conductive particle group (wt %);
Xn: content of an nth conductive particle group (wt %) when a number of the groups of conductive particle having different particle diameter distributions is greater than two, Xn being absent when the number of groups of the conductive particles is two;
Y1: D50 of first conductive particle group;
Y2: D50 of second conductive particle group;
Yn: D50 of the nth conductive particle group when the number of the groups of conductive particle having different particle diameter distributions is greater than two, Yn being absent when the number of groups of the conductive particles is two;
Z1: D90 of first conductive particle group;
Z2: D90 of second conductive particle group;
Zn: D90 of the nth conductive particle group when the number of the groups of conductive particle having different particle diameter distributions is greater than two, Zn being absent when the number of groups of the conductive particles is two; and
n: an integer of 3 or more when a number of the groups of conductive particle having different particle diameter distributions is greater than two.

The conductive particles may include at least one selected from the group of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO) particles.

The paste composition may have a scattering of efficiency of about 0.15 or less in a sintering temperature range from about 900° C. to about 930° C.

The conductive particles may have an average particle diameter (D50') of from about 1 µm to about 1.85 µm.

The conductive particles may have a particle diameter (D90') of from about 1 µm to about 3.10 µm.

The conductive particles may include about 28~32 parts by weight of a first conductive particle group, about 23~25 parts by weight of a second conductive particle group, about 18~22 parts by weight of a third conductive particle group, and about 8~12 parts by weight of a fourth conductive particle group, based on 100 parts by weight of the paste composition. The first conductive particle group may have a particle diameter (D10) of about 0.9~1.1 µm, a particle diameter (D50) of about 1.3~1.5 µm, and a particle diameter (D90) of about 2.1~2.3 µm. The second conductive particle group may have a particle diameter (D10) of about 0.3~0.5 µm, a particle diameter (D50) of about 0.7~0.9 µM, and a particle diameter (D90) of about 1.2~1.4 µm. The third conductive particle group may have a particle diameter (D10) of about 1.5~1.7 µm, a particle diameter (D50) of about 2.7~2.9 µm, and a particle diameter (D90) of about 4.2~4.4 µm. The fourth conductive particle group may have a particle diameter (D10) of about 0.9~1.1 µm, a particle diameter (D50) of about 2.6~2.8 µm, and a particle diameter (D90) of about 6.1~6.3 µm.

The paste composition may include about 60~90 wt % of the conductive particles, about 1~15 wt % of the glass fit, and about 5~25 wt % of the organic binder and solvent.

The paste composition may further include at least one additive selected from the group of a dispersant, a thixotropic agent, a plasticizer, a viscosity stabilizer, an anti-foaming agent, a pigment, a UV stabilizer, an antioxidant, and a coupling agent.

Embodiments are also directed to an electrode formed of the paste composition

Embodiments are also directed to a solar cell including the electrode.

BRIEF DESCRIPTION OF THE DRAWING

Features will become apparent to those of skill in the art by describing in detail exemplary embodiments with reference to the attached drawings in which:

FIG. 1 illustrates a schematic view of a solar cell manufactured using a paste in accordance with an exemplary embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the scope thereof to those skilled in the art. In the drawing FIGURE, the dimensions of layers and regions may be exaggerated for clarity of illustration.

In an embodiment, a paste composition for solar cell electrodes may include conductive particles, a glass frit, an organic binder and a solvent. According to an implementation, the paste composition may include about 60~90 wt % of the conductive particles, about 1~15 wt % of the glass frit, and about 5~25 wt % of the organic binder and solvent.

Conductive Particles

The conductive particles include at least two groups of conductive particles having different particle diameter distributions. The conductive particles may have an average particle diameter (D50'), according to the following Equation 1, of about 1.85 μm or less, and a particle diameter (D90') at 90% of the cumulative particle diameter distribution, according to the following Equation 2, of about 3.10 μm or less.

$$\text{average particle diameter } (D50') = \frac{(X1*Y1) + (X2*Y2) + \ldots + (Xn*Yn)}{X1 + X2 + \ldots + Xn} \quad \text{[Equation 1]}$$

$$\text{particle diameter at 90\% of the cumulative particle diameter distribution } (D90') = \frac{(X1*Z1) + (X2*Z2) + \ldots + (Xn*Zn)}{X1 + X2 + \ldots + Xn} \quad \text{[Equation 2]}$$

where,
X1: content of first conductive particle group (wt %)
X2: content of second conductive particle group (wt %)
Xn: content of nth conductive particle group (wt %)
Y1: D50 of first conductive particle group
Y2: D50 of second conductive particle group
Yn: D50 of nth conductive particle group
Z1: D90 of first conductive particle group
Z2: D90 of second conductive particle group
Zn: D90 of nth conductive particle group Here, the term "content of the first conductive particle group (wt %)" refers to a weight percentage of the first conductive particle group based on the total weight of the conductive particles.

Here, the term "content of the nth conductive particle group (wt %)" refers to a weight percentage of the nth conductive particle group based on the total weight of the conductive particles.

Here, n is an integer of 3 or more. For example, n may be in the range of 3~5. When only two groups of the conductive particles having different particle diameter distributions are present, Xn, Yn, and Zn are absent.

Embodiments may be directed to reducing a variation of contact resistance caused by wafer or process conditions, widening a temperature range for optimal sintering, and improving conversion efficiency of a solar cell including electrodes formed of the paste composition, by adjusting the size distribution of two or more kinds of conductive particles in the paste composition for solar cell electrodes.

As for the conductive particles, either organic conductive or inorganic conductive particles may be used. For example, the conductive particles may include at least one selected from the group of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO) particles. These particles may be used alone or as a mixture of two or more thereof.

For example, the conductive particles may include silver (Ag) particles. The conductive particles may further include nickel (Ni), cobalt (Co), iron (Fe), zinc (Zn), or copper (Cu) particles in addition to silver (Ag) particles.

The conductive particles may have a spherical shape, a flake shape, an amorphous shape, or a combination thereof. In an embodiment, the conductive particle may have a spherical shape to further improve a fill factor, sintering density, and UV transmittance.

In an embodiment, the paste for solar cell electrodes may have a scattering of efficiency of about 0.15 or less, preferably from about 0.01 to about 0.15, and more preferably about 0.10 or less, in a sintering zone from about 900° C. to about 930° C.

As used herein, the term "scattering of efficiency" refers to a standard deviation, which is calculated using 10 average efficiency values of each of electrodes for 10 silicon substrates that are subjected to printing of an electrode pattern and sintering. Lower scattering of efficiency (standard deviation) may indicate a wider sintering margin. Generally, as the scattering of efficiency decreases, there may be a problem in that an average efficiency may be lowered upon adjustment of process variables.

If the scattering of efficiency is greater than about 0.15 in the sintering zone, the sintering margin may excessively decrease, causing problems in terms of process stability.

In an embodiment, the conductive particles may have an average particle diameter (D50') from about 1 μm to about 1.85 μm, preferably about 1 μm to about 1.78 μm.

In an embodiment, the conductive particles may have an average particle diameter (D90') from about 1 μm to about 3.10 μm, preferably about 1 μm to about 3.01 μm.

In the conductive particles according to an embodiment, the particle diameter (D10) of the first conductive particle group is not identical to the particle diameter (D10) of the nth conductive particle group. In other implementations, the particle diameter (D50) of the first conductive particle group is not identical to the particle diameter (D50) of the nth conductive particle group. In other implementations, the particle diameter (D90) of the first conductive particle group is not identical to the particle diameter (D90) of the nth conductive particle group.

In an embodiment, the conductive particles may include about 33~37 parts by weight of a first conductive particle group, about 13~17 parts by weight of a second conductive particle group, about 13~17 parts by weight of a third conductive particle group, about 8~12 parts by weight of a fourth conductive particle group, and about 8~12 parts by weight of a fifth conductive particle group, based on 100 parts by weight of the paste composition. The first conductive particle group may have a particle diameter (D10) of about 1.1~1.3 μm, a particle diameter (D50) of about 1.7~1.9 μm, and a particle diameter (D90) of about 2.7~2.9 μm. The second conductive particle group may have a particle diameter (D10) of about 0.9~1.1 μm, a particle diameter (D50) of about 1.3~1.5 μm, and a particle diameter (D90) of about 2.12.3 μm. The third conductive particle group may have a particle diameter (D10)

of about 0.3~0.5 μm, a particle diameter (D50) of about 0.7~0.9 μm, and a particle diameter (D90) of about 1.2~1.4 μm. The fourth conductive particle group may have a particle diameter (D10) of about 1.5~1.7 μm, a particle diameter (D50) of about 2.7~2.9 μm, and a particle diameter (D90) of about 4.2~4.4 μm. The fifth conductive particle group may have a particle diameter (D10) of about 0.9~1.1 μm, a particle diameter (D50) of about 2.6~2.8 μm, and a particle diameter (D90) of about 6.1~6.3 μm. The glass fit, organic binder and solvent may be present in a remaining amount, except for the amount of the conductive particles, based on 100 parts by weight of the paste composition.

In another embodiment, the conductive particles may include about 48~52 parts by weight of a first conductive particle group, about 13~17 parts by weight of a second conductive particle group, about 8~12 parts by weight of a third conductive particle group, and about 8~12 parts by weight of a fourth conductive particle group, based on 100 parts by weight of the paste composition. The first conductive particle group may have a particle diameter (D10) of about 0.9~1.1 μm, a particle diameter (D50) of about 1.3~1.5 μm, and a particle diameter (D90) of about 2.1 2.3 μm. The second conductive particle group may have a particle diameter (D10) of about 0.3~0.5 μm, a particle diameter (D50) of about 0.7~0.9 μm, and a particle diameter (D90) of about 1.2~1.4 μm. The third conductive particle group may have a particle diameter (D10) of about 1.5~1.7 μm, a particle diameter (D50) of about 2.7~2.9 μm, and a particle diameter (D90) of about 4.2~4.4 μm. The fourth conductive particle group may have a particle diameter (D10) of about 0.9~1.1 μm, a particle diameter (D50) of about 2.6~2.8 μm, and a particle diameter (D90) of about 6.1~6.3 μm. The glass fit, organic binder and solvent may present in a remaining amount, except for the amount of the conductive particles, based on 100 parts by weight of the paste composition.

In a further embodiment, the conductive particles may include about 18~22 parts by weight of a first conductive particle group, about 28~32 parts by weight of a second conductive particle group, about 13~17 parts by weight of a third conductive particle group, about 8~12 parts by weight of a fourth conductive particle group, and about 8~12 parts by weight of a fifth conductive particle group, based on 100 parts by weight of the paste composition. The first conductive particle group may have a particle diameter (D10) of about 1.1~1.3 μm, a particle diameter (D50) of about 1.7~1.9 μm, and a particle diameter (D90) of about 2.7~2.9 μm. The second conductive particle group may have a particle diameter (D10) of about 0.9~1.1 μm, a particle diameter (D50) of about 1.3~1.5 μm, and a particle diameter (D90) of about 2.1 2.3 μm. The third conductive particle group may have a particle diameter (D10) of about 0.3~0.5 μm, a particle diameter (D50) of about 0.7~0.9 μm, and a particle diameter (D90) of about 1.2~1.4 μm. The fourth conductive particle group may have a particle diameter (D10) of about 1.5~1.7 μm, a particle diameter (D50) of about 2.7~2.9 μm, and a particle diameter (D90) of about 4.2~4.4 μm. The fifth conductive particle group may have a particle diameter (D10) of about 0.9~1.1 μm, a particle diameter (D50) of about 2.6~2.8 μm, and a particle diameter (D90) of about 6.1~6.3 μm. The glass frit, organic binder and solvent may be present in a remaining amount, except for the amount of the conductive particles, based on 100 parts by weight of the paste composition.

In yet another embodiment, the conductive particles may include about 28~32 parts by weight of a first conductive particle group, about 23~27 parts by weight of a second conductive particle group, about 18~22 parts by weight of a third conductive particle group, and about 8~12 parts by weight of a fourth conductive particle group, based on 100 parts by weight of the paste composition. The first conductive particle group may have a particle diameter (D10) of about 0.9~1.1 μm, a particle diameter (D50) of about 1.3~1.5 μm, and a particle diameter (D90) of about 2.1~2.3 μm. The second conductive particle group may have a particle diameter (D10) of about 0.3~0.5 μm, a particle diameter (D50) of about 0.7~0.9 μm, and a particle diameter (D90) of about 1.2~1.4 μm. The third conductive particle group may have a particle diameter (D10) of about 1.5~1.7 μm, a particle diameter (D50) of about 2.7~2.9 μm, and a particle diameter (D90) of about 4.2~4.4 μm. The fourth conductive particle group may have a particle diameter (D10) of about 0.9~1.1 μm, a particle diameter (D50) of about 2.6~2.8 μm, and a particle diameter (D90) of about 6.1~6.3 μm. The glass frit, organic binder and solvent are present in a remaining amount, except for the amount of the conductive particles, based on 100 parts by weight of the paste composition.

By way of example, D50, D90 and D10 may be measured using a Model 1064D (CILAS Co., Ltd.) after dispersing the conductive powder in isopropyl alcohol (IPA) at 25° C. for 3 minutes via ultrasonication.

In an embodiment, the paste composition may include about 60~90 wt % of the conductive particles, about 1~15 wt % of the glass frit, and about 5~25 wt % of the organic binder and solvent.

The conductive particles may be present in an amount of about 60~90 wt % in the paste composition. Within this range, it may be possible to help prevent a deterioration in conversion efficiency due to an increase of resistance and to help prevent a difficulty in forming the paste due to a relative reduction in an amount of the organic vehicle. The conductive particles are preferably present in an amount of about 70~88 wt %.

Glass Frit

The glass frit may serve to enhance adhesion of the conductive particles with respect to a wafer and to generate crystals of the conductive particles in an emitter region by etching an anti-reflection layer and melting the conductive particles so as to reduce contact resistance during a burning process of the paste.

The glass frit may include a crystallized glass frit or non-crystallized glass frit. The glass frit may be any of a leaded glass frit, a lead-free glass frit, or mixtures thereof.

For example, the glass frit may include at least one selected from zinc oxide-silicon oxide ($ZnO-SiO_2$), zinc oxide-boron oxide-silicon oxide ($ZnO-B_2O_3-SiO_2$), zinc oxide-boron oxide-silicon oxide-aluminum oxide ($ZnO-B_2O_3-SiO_2-Al_2O_3$), bismuth oxide-silicon oxide ($Bi_2O_3-SiO_2$), bismuth oxide-boron oxide-silicon oxide ($Bi_2O_3-B_2O_3-SiO_2$), bismuth oxide-boron oxide-silicon oxide-aluminum oxide ($Bi_2O_3-B_2O_3-SiO_2-Al_2O_3$), bismuth oxide-zinc oxide-boron oxide-silicon oxide ($Bi_2O_3-ZnO-B_2O_3-SiO_2$), and bismuth oxide-zinc oxide-boron oxide-silicon oxide-aluminum oxide ($Bi_2O_3-ZnO-B_2O_3-SiO_2-Al_2O_3$) glass frit.

The glass frit may have an average particle diameter (D50) ranging from about 0.1 μm to about 5 μm, preferably from about 0.5 μm to about 3 μm. Within this range, the glass frit may neither obstruct deep curing of UV waves nor cause pin-hole failure during development in fabrication of electrodes.

The glass fit may have a transition point of about 300° C. to about 600° C., preferably about 400° C. to about 550° C.

The glass frit may be present in an amount of about 1 wt % to about 15 wt % in the paste composition. Within this range, it may be possible to improve sintering properties and adhesion of the conductive particles while preventing deterioration in conversion efficiency due to resistance increase. Further, it may be possible to prevent an excessive amount of glass fit from remaining after burning, which could cause an increase in resistance and deterioration in wettability. As an example, the glass frit may be present in an amount of about 1 wt % to about 7 wt %.

Organic Binder and Solvent

Examples of the organic binder include acrylic polymers obtained by copolymerization with hydrophilic acrylic monomers such as carboxyl groups; and cellulose polymers, such as ethyl cellulose, hydroxyethyl cellulose, hydroxypropyl cellulose, and hydroxyethyl hydroxypropyl cellulose. These organic binders may be may be used alone or as a mixture of two or more thereof.

The organic binder and the solvent may be mixed in a ratio of about 5:95 to about 40:60 (weight ratio). For example, the organic binder and the solvent may be mixed in about 7:93 to about 30:70 (weight ratio).

The solvent may be an organic solvent having a boiling point of about 120° C. or more. Examples of the solvent include methyl cellosolve, ethyl cellosolve, butyl cellosolve, aliphatic alcohols, α-terpineol, β-terpineol, dihydro-terpineol, ethylene glycol, ethylene glycol mono butyl ether, butyl cellosolve acetate and texanol. These solvents may be used alone or as a mixture of two or more thereof.

The organic binder and the solvent may be present in a total amount of about 5 to about 25 wt % in the paste. Within this range, it may be possible to prevent inefficient dispersion or an excessive increase in viscosity after preparation of the paste, which could lead to printing difficulty, and to prevent an increase in resistance and other problems that could occur during the burning process. As an example, the organic binder and the solvent may be present in a total amount of about 10 wt % to about 15 wt %.

In some embodiments, the paste composition may further include typical additives, as desired, to enhance flow properties, process properties, and stability. The additives may include, for example, a plasticizer, a dispersant, a thixotropic agent, a viscosity stabilizer, an anti-foaming agent, a pigment, a UV stabilizer, an antioxidant, a coupling agent, and the like. These additives may be used alone or as a mixture of two or more thereof. These additives may be present in an amount of about 0.1 wt % to about 5 wt % in the paste composition, but this amount may be changed, as desired.

Other embodiments provide an electrode formed using the paste composition as described herein, and a solar cell including the same.

FIG. 1 illustrates a schematic view of a solar cell manufactured using a paste in accordance with an exemplary embodiment.

Referring to FIG. 1, a rear electrode 210 and a front electrode 230 may be formed by printing and burning the paste on a wafer or substrate 100 that includes a p-layer 101 and an n-layer 102, which will serve as an emitter. For example, a preliminary process for preparing the rear electrode 210 may be performed by printing the paste on the rear surface of a wafer 100 and drying the printed paste at about 200~400° C. for about 10~60 seconds. Further, a preliminary process for preparing the front electrode may be performed by printing the paste on the front surface of the wafer and drying the printed paste. Then, the front electrode 230 and the rear electrode 210 may be formed by burning the wafer at about 400 to about 900° C. for about 30 to 50 seconds.

In the fabrication of electrodes using the paste composition as described herein, thin film electrodes may be formed using the paste composition and subjected to sintering. An optimal sintering temperature may vary according to wafer or process conditions. Accordingly, it may be desirable to perform sintering at an optimal sintering temperature in order to improve solar cell efficiency. According to embodiments, it is desirable to reduce a variation in contact resistance resulting from changes of conditions by widening the optimal sintering temperature range through adjustment of the particle diameter distribution in the paste composition.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

EXAMPLES

Specifications of components used in the following examples and comparative examples were as follows:

(A) Conductive Particles

Spherical particles listed in Table 1 were applied to the examples and the comparative examples.

TABLE 1

|  | D10(μm) | D50(μm) | D90(μm) | Manufacturer |
| --- | --- | --- | --- | --- |
| 4-11F | 1.2 | 1.8 | 2.8 | DOWA |
| 3-11F | 1.0 | 1.4 | 2.2 | DOWA |
| G-35 | 3.0 | 5.8 | 10.6 | DOWA |
| 2-8 | 0.3 | 1.0 | 1.9 | DOWA |
| 2-1C | 0.4 | 0.8 | 1.3 | DOWA |
| 5-11F | 1.6 | 2.8 | 4.3 | DOWA |
| HP0202E | 1.0 | 2.7 | 6.2 | Heesung Metal |

(B) Glass Frit

Leaded glass frit having an average particle diameter (D50) of 1.0 μm and a transition point of 451° C. (Leaded Glass, PSL1004C, Particlogy Co., Ltd.) was used.

(C) Organic Binder and Solvent:

Ethyl cellulose (Dow Chemical Co., Ltd., STD4) was used as an organic binder, and butyl carbitol was used as a solvent.

The kinds and amounts of conductive particles used in Examples 1 to 4 and Comparative Examples 1 to 4 are listed in Table 2 (unit: parts by weight). In all of the examples and comparative examples, the conductive particles, the glass frit, the organic binder, and the solvent were present in amounts of 85 wt %, 3 wt %, 1 wt %, and 11 wt %, respectively.

TABLE 2

| Conductive particle group | 4-11F | 3-11F | G-35 | 2-8 | 2-1C | 5-11F | HP0202E |
| --- | --- | --- | --- | --- | --- | --- | --- |
| Example 1 | 35 | 15 | 0 | 0 | 15 | 10 | 10 |
| Example 2 | 0 | 50 | 0 | 0 | 15 | 10 | 10 |
| Example 3 | 20 | 30 | 0 | 0 | 15 | 10 | 10 |
| Example 4 | 0 | 30 | 0 | 0 | 25 | 20 | 10 |
| Comparative example 1 | 29 | 18 | 10 | 0 | 23 | 0 | 5 |
| Comparative example 2 | 29 | 18 | 5 | 0 | 18 | 10 | 5 |
| Comparative example 3 | 35 | 15 | 0 | 15 | 0 | 10 | 10 |
| Comparative example 4 | 35 | 20 | 10 | 10 | 0 | 0 | 10 |

Examples 1 to 4 and Comparative Examples 1 to 4

For each of Examples 1 to 4 and Comparative Examples 1 to 4, a paste containing the conductive particles in the amounts indicated in Table 2 was deposited on a screen plate by scrapper rolling, and printed by ejecting the paste towards an image area on the screen plate using a squeezer. Then, an average efficiency and an efficiency dispersion of a silicon wafer in a sintering interval of 30° C. were obtained while changing a 6 zone sintering temperature by 10° C.

The average particle diameter (D50'), the particle diameter (D90') at 90% of the cumulative particle diameter distribution, the average efficiency in an optimal sintering zone of 900~930° C., and the scattering of efficiency in an optimal sintering zone of 900~930° C. of the paste of Examples 1 to 4 and Comparative Examples 1 to 4 are listed in Table 3.

TABLE 3

| | D50' (μm) | D90' (μm) | Optimal sintering zone average efficiency (%) | Optimal sintering zone scattering of efficiency |
|---|---|---|---|---|
| Example 1 | 1.78 | 3.01 | 17.45 | 0.15 |
| Example 2 | 1.61 | 2.76 | 17.37 | 0.14 |
| Example 3 | 1.71 | 2.90 | 17.68 | 0.08 |
| Example 4 | 1.57 | 2.90 | 17.62 | 0.08 |
| Comparative example 1 | 1.97 | 3.38 | 17.35 | 0.31 |
| Comparative example 2 | 1.91 | 3.19 | 17.47 | 0.20 |
| Comparative example 3 | 1.81 | 3.11 | 17.48 | 0.17 |
| Comparative example 4 | 1.92 | 3.05 | 17.50 | 0.19 |

As shown in Table 3, the pastes according to Examples 1 to 4 had a particle diameter (D50') of 1.78 μm or less and a particle diameter (D90') of 3.01 μm or less. As such, when the conductive particles satisfied all of particle diameter conditions according to the embodiments, the scattering of efficiency in an optimal sintering zone was 0.15 or less.

Not only when the particle diameters (D50') and (D90') deviated from the values described herein, as in Comparative example 1, but also when the particle diameter (D50') was in the range of 1.85 μm or less but the particle diameter (D90') was not in the range of 3.10 μm or less as in Comparative example 3, or when the particle diameter (D90') was in the range of 3.10 μm or less but the particle diameter (D50') was not in the range of 1.85 μm or less as in Comparative example 4, the scattering of efficiency in an optimal sintering zone exceeded 0.15. Accordingly, it could be ascertained that, as compared with those of Comparative Examples 1 to 4, the pastes according to Examples 1 to 4 provided a sintering margin without loss of the average efficiency while maintaining a scattering of efficiency of 0.15.

By way of summation and review, the development of electrode pastes having a wide temperature range may be desirable for optimal sintering enhancement of average efficiency. In the fabrication of a crystalline silicon solar cell, conditions for optimal sintering may vary due to a surface treatment of a silicon substrate, formation of an anti-reflection layer, and an uneven thickness of an emitter layer. Variation of a temperature for optimal sintering resulting from the fluctuation of a wafer condition may cause an increase of a scattering of efficiency of a solar cell, thereby reducing the conversion efficiency of the solar cell.

In order to improve the conversion efficiency of a solar cell by minimizing a variation of an optimal sintering condition caused by a fluctuation of wafer or process conditions, there have been attempts to solve the problem through an adjustment of a composition of a glass frit to have a wide temperature range for optimal sintering.

According to embodiments, a paste composition is provided in which a wide temperature range for optimal sintering may be obtained through an adjustment of the particle diameter of conductive particles in order to improve the conversion efficiency of a solar cell.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope as set forth in the following claims.

What is claimed is:

1. A paste composition for a solar cell electrode, the paste composition comprising:
   about 60~90 wt % of conductive particles;
   about 1~15 wt % of a glass frit;
   a total amount of about 5~25 wt % of an organic binder; and
   a solvent,
   wherein:
   the conductive particles include at least two groups of conductive particle having different particle diameter distributions,
   the conductive particles have an average particle diameter (D50') according to the following Equation 1 of about 1.85 μm or less and a particle diameter (D90') at 90% of the cumulative particle diameter distribution according to the following Equation 2 of about 3.10 μm or less:

$$\text{average particle diameter } (D50') = \frac{(X1*Y1) + (X2*Y2) + \ldots + (Xn*Yn)}{X1 + X2 + \ldots + Xn} \quad [\text{Equation 1}]$$

$$\text{particle diameter at 90\% of the cumulative particle diameter distribution } (D90') = \frac{(X1*Z1) + (X2*Z2) + \ldots + (Xn*Zn)}{X1 + X2 + \ldots + Xn} \quad [\text{Equation 2}]$$

where,
X1: content of first conductive particle group (wt %);
X2: content of second conductive particle group (wt %);
Xn: content of an nth conductive particle group (wt %) when a number of the groups of conductive particle having different particle diameter distributions is greater than two, Xn being absent when the number of groups of the conductive particles is two;
Y1: D50 of first conductive particle group;
Y2: D50 of second conductive particle group;
Yn: D50 of the nth conductive particle group when the number of the groups of conductive particle having different particle diameter distributions is greater than two, Yn being absent when the number of groups of the conductive particles is two;
Z1: D90 of first conductive particle group;
Z2: D90 of second conductive particle group;
Zn: D90 of the nth conductive particle group when the number of the groups of conductive particle having different particle diameter distributions is greater than two, Zn being absent when the number of groups of the conductive particles is two; and
n: an integer of 3 or more when a number of the groups of conductive particle having different particle diameter distributions is greater than two; and wherein the paste composition has a scattering of efficiency of 0.15 or less in a sintering temperature range from about 900° C. to about 930° C.

2. The paste composition as claimed in claim 1, wherein the conductive particles include at least one selected from the group of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO) particles.

3. The paste composition as claimed in claim 1, wherein the conductive particles have an average particle diameter (D50') of from about 1 μm to about 1.85 μm.

4. The paste composition as claimed in claim 1, wherein the conductive particles have a particle diameter (D90') of from about 1 μm to about 3.10 μm.

5. The paste composition as claimed in claim 1, wherein:
the conductive particles include about 28~32 parts by weight of a first conductive particle group, about 23~25 parts by weight of a second conductive particle group, about 18~22 parts by weight of a third conductive particle group, and about 8~12 parts by weight of a fourth conductive particle group, based on 100 parts by weight of the paste composition,
the first conductive particle group has a particle diameter (D10) of about 0.9~1.1 μm, a particle diameter (D50) of about 1.3~1.5 μm, and a particle diameter (D90) of about 2.1~2.3 μm,
the second conductive particle group has a particle diameter (D10) of about 0.3~0.5 μm, a particle diameter (D50) of about 0.7~0.9 μm, and a particle diameter (D90) of about 1.2~1.4 μm,
the third conductive particle group has a particle diameter (D10) of about 1.5~1.7 μm, a particle diameter (D50) of about 2.7~2.9 μm, and a particle diameter (D90) of about 4.2~4.4 μm, and
the fourth conductive particle group has a particle diameter (D10) of about 0.9-1.1 μm, a particle diameter (D50) of about 2.6~2.8 μm, and a particle diameter (D90) of about 6.1~6.3 μm.

6. The paste composition as claimed in claim 1, further comprising at least one additive selected from the group of a dispersant, a thixotropic agent, a plasticizer, a viscosity stabilizer, an anti-foaming agent, a pigment, a UV stabilizer, an antioxidant, and a coupling agent.

7. An electrode formed of the paste composition as claimed in claim 1.

8. A solar cell including the electrode as claimed in claim 7.

9. A paste composition for a solar cell electrode, the paste composition comprising:
conductive particles; a glass frit; an organic binder; and a solvent; wherein:
the conductive particles include about 28~32 parts by weight of a first conductive particle group, about 23~25 parts by weight of a second conductive particle group, about 18~22 parts by weight of a third conductive particle group, and about 8~12 parts by weight of a fourth conductive particle group, based on 100 parts by weight of the paste composition, wherein:
the first conductive particle group has a particle diameter (D10) of about 0.9~1.1 μm, a particle diameter (D50) of about 1.3~1.5 μm, and a particle diameter (D90) of about 2.1~2.3 μm,
the second conductive particle group has a particle diameter (D10) of about 0.3~0.5 μm, a particle diameter (D50) of about 0.7~0.9 μm, and a particle diameter (D90) of about 1.2~1.4 μm,
the third conductive particle group has a particle diameter (D10) of about 1.5~1.7 μm, a particle diameter (D50) of about 2.7~2.9 μm, and a particle diameter (D90) of about 4.2~4.4 μm, and
the fourth conductive particle group has a particle diameter (D10) of about 0.9~1.1 μM, a particle diameter (D50) of about 2.6~2.8 μm, and a particle diameter (D90) of about 6.1~6.3 μm.

* * * * *